United States Patent
Lassalle-Balier et al.

(10) Patent No.: US 12,270,869 B2
(45) Date of Patent: Apr. 8, 2025

(54) MAGNET STRUCTURE FOR BACK-BIASED SENSORS

(71) Applicant: Allegro MicroSystems, LLC, Manchester, NH (US)

(72) Inventors: Rémy Lassalle-Balier, Bures sur Yvette (FR); Jeffrey Eagen, Manchester, NH (US); Damien Dehu, La-Ville-du-Bois (FR)

(73) Assignee: Allegro MicroSystems, LLC, Manchester, NH (US)

( * ) Notice: Subject to any disclaimer, the term of this patent is extended or adjusted under 35 U.S.C. 154(b) by 6 days.

(21) Appl. No.: 17/648,601

(22) Filed: Jan. 21, 2022

(65) Prior Publication Data

US 2023/0236268 A1    Jul. 27, 2023

(51) Int. Cl.
*G01R 33/07* (2006.01)
*G01R 33/09* (2006.01)

(52) U.S. Cl.
CPC ........... *G01R 33/07* (2013.01); *G01R 33/093* (2013.01); *G01R 33/098* (2013.01)

(58) Field of Classification Search
CPC .... G01R 33/07; G01R 33/093; G01R 33/098; G01R 33/0005; G01R 33/0023
See application file for complete search history.

(56) References Cited

U.S. PATENT DOCUMENTS

| | | | |
|---|---|---|---|
| 5,781,005 A | 7/1998 | Vig et al. | |
| 6,265,865 B1 | 7/2001 | Engel et al. | |
| 10,809,094 B2 | 10/2020 | Foletto et al. | |
| 10,921,391 B2 | 2/2021 | Cadugan et al. | |
| 2007/0018641 A1* | 1/2007 | Hayashi | G01R 33/09 324/249 |
| 2014/0292312 A1* | 10/2014 | Chen | G01R 33/098 324/207.21 |
| 2020/0041310 A1 | 2/2020 | Lassalle-Balier et al. | |
| 2020/0225020 A1* | 7/2020 | Lassalle-Balier | G01B 7/14 |
| 2020/0312908 A1* | 10/2020 | Oguz | H10N 52/01 |

OTHER PUBLICATIONS

Allegro Microsystems, "Large Air Gap, GMR Transmission Speed and Direction Sensor IC for Gear Tooth Sensing," Feb. 16, 2021, 16 Pages.
Allegro Microsystems, "Packaging | Allegro MicroSystems," https://www.allegromicro.com/en/design-support/packaging, Oct. 4, 2021, 3 Pages.

* cited by examiner

*Primary Examiner* — Alvaro E Fortich
(74) *Attorney, Agent, or Firm* — Daly, Crowley, Mofford & Durkee, LLP

(57) ABSTRACT

According to an embodiment, a magnetic field sensor includes: one or more magnetic field sensing elements; and a magnet structure to provide a bias magnetic field about the one or more magnetic field sensing elements, the magnet structure includes alternating magnetic layers and non-magnetic layers with at least three magnetic layers.

19 Claims, 10 Drawing Sheets

(top view)

(front view)

MAGNET STRUCTURE FOR BACK-BIASED SENSORS

BACKGROUND

Various types of magnetic field sensing elements are known, including Hall Effect elements and magnetoresistance (MR) elements such as giant magnetoresistance (GMR) and tunnel magnetoresistance (TMR) elements. Magnetic field sensors provide an electrical signal representative of a sensed magnetic field. Magnetic field sensors generally include one or more magnetic field sensing elements and other electronic components. Some magnetic field sensors also include a permanent magnet in a so-called "back bias" arrangement. In such sensors, the sensed magnetic field is a magnetic field generated by the back-bias magnet varies in the presence of a moving ferromagnetic object (or "target").

Magnetic field sensors are widely used in modern systems to measure or detect physical parameters, such as magnetic field strength, current, position, motion, orientation, and so forth. There are many different types of sensors for measuring magnetic fields and other parameters. However, such sensors suffer from various limitations, for example, excessive size, inadequate sensitivity and/or dynamic range, cost, reliability and the like. In addition, positional misalignment of a magnetic sensing element can degrade sensor performance.

SUMMARY

Embodiments of the present disclosure provide a magnet structure design that can be used with back-biased MR sensors. The magnet design may be assembled on the back of sensor integrated circuit (IC) packages and may be immune to certain misalignments between the magnet and the IC die such that assembly can be done by a customer after the time of manufacture (e.g., outside of a factory setting). The magnet design can be used to back-biased MR structures that are split into two or more segments and the dimension of the magnet can be adjusted to accommodate different spacings between the split MR structure, thus allowing for different sized dies. Embodiments provide a magnet structure having a layered design where the dimensions of the layers or sections can be adjusted to provide suitable back bias magnetic field lines at various magnet and die dimensions.

According to one aspect of the present disclosure, a magnetic field sensor may include: one or more magnetic field sensing elements; and a magnet structure to provide a bias magnetic field about the one or more magnetic field sensing elements, the magnet structure includes alternating magnetic layers and non-magnetic layers with at least three magnetic layers.

According to another aspect of the present disclosure, a magnetic field sensor may include: one or more magnetic field sensing elements; and a magnet structure means for providing a bias magnetic field about the one or more magnetic field sensing elements while being immune to certain misalignment between the magnet structure and the one or more magnetic field sensing elements.

In some embodiments, the magnet structure may include three magnetic layers and two non-magnetic layers. In some embodiments, the magnet structure may have a dimension defined by dimensions of individual ones of the magnetic layers and dimensions of individual ones of the non-magnetic layers. In some embodiments, the magnet structure can have a parallelepiped shape. In some embodiments, the one or more magnetic field sensing elements may include one or more magnetoresistance (MR) elements. In some embodiments, the one or more magnetic field sensing elements may include three magnetoresistance (MR) elements. In some embodiments, the one or more magnetic field sensing elements can include one or more Hall effect elements. In some embodiments, the one or more magnetic field sensing elements may be enclosed with a packaging configured for attachment of the magnet structure. In some embodiments, the one or more magnetic field sensing elements can include at least three magnetic field sensing elements, wherein the bias magnetic field provided by the magnet structure includes at least three field lines aligned with corresponding ones of the magnetic field sensing elements.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
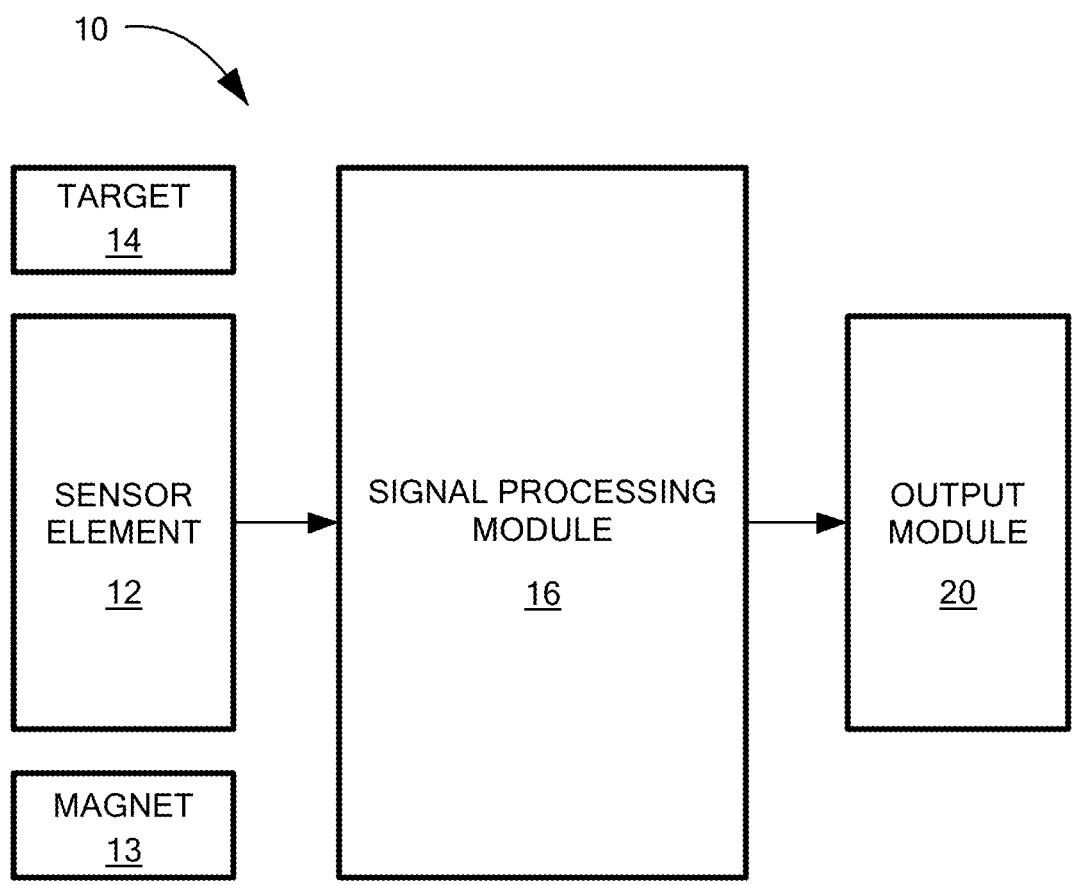
FIG. 1 is a block diagram of a magnetic field sensor using a back bias magnet, according to some embodiments of the present disclosure.

FIG. 1 shows an example of a magnetic field sensor 10 including one or more magnetic field sensing elements 12 and a back bias magnet structure 13 positioned in relation thereto. In some embodiments, the magnetic field sensing elements 12 sense a target 14, such as a ferromagnetic target, that causes changes in a magnetic field. A signal processing module 16 is coupled to magnetic field sensing elements 12 to process the signals generated thereby. Signal processing module 16 can include analog and/or digital circuitry for adjusting the gain and/or offset of a signal generated by magnetic field sensing elements 12, and/or for performing other application-specific processing on said signal. In some embodiments, signal processing module 16 may including circuitry to convert an along input signal into a digital output signal. An output module 20 is coupled to the signal processing module 16 to provide an output signal suitable for use in an application (e.g., a device or system) in which magnetic field sensor 10 is provided. Output module 20 can include analog and/or digital circuitry configured to prepare a signal output by signal processing module 16 into a signal suitable for use by the application. Such applications can include, for example, automobile control systems and other safety critical applications.

In some embodiments, magnetic field sensing elements 12, signal processing module 16, and output module 20 may be integrated into an IC die and packaged, e.g., enclosed or encased within a plastic molding and incorporated within a 3-Pin system-in-package (SIP). The IC package and magnet structure 13 may be provided as separate parts to a customer and assembled by the customer in a non-factory setting. Disclosed embodiments provide a magnet structure and design thereof that is immune to certain misalignments between the die and magnet structure.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor element. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Magnetoresistance refers to the dependence of the electrical resistance of a sample on the strength of external magnetic field characterized as:

$$\delta_H = [R(0) - R(H)]/R(0) \tag{1}$$

where R(H) is the resistance of the sample in a magnetic field H, and R(0) corresponds to H=0. The term "giant magnetoresistance" (GMR) indicates that the value $\delta_H$ for multilayer structures significantly exceeds the anisotropic magnetoresistance, which has a typical value within a few percent. Tunnel magnetoresistance (TMR) is a magnetoresistive effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other.

In some embodiments, magnetic field sensing elements 12 may include one or more MR sensing elements, such as GMR or TMR elements. For example, magnetic field sensing elements 12 may include a GMR element that having layered configuration similar to that shown and described in the context of FIG. 2. Sensing elements 12 can react to the changing magnetic field caused by target 14 by producing corresponding resistances changes. Illustrative arrangements of MR elements and connections therebetween that may be used are described below in the context of FIGS. 7, 7A, and 7B. In other embodiments, magnetic field sensing elements 12 may include one or more Hall effect elements.

Figure 2:
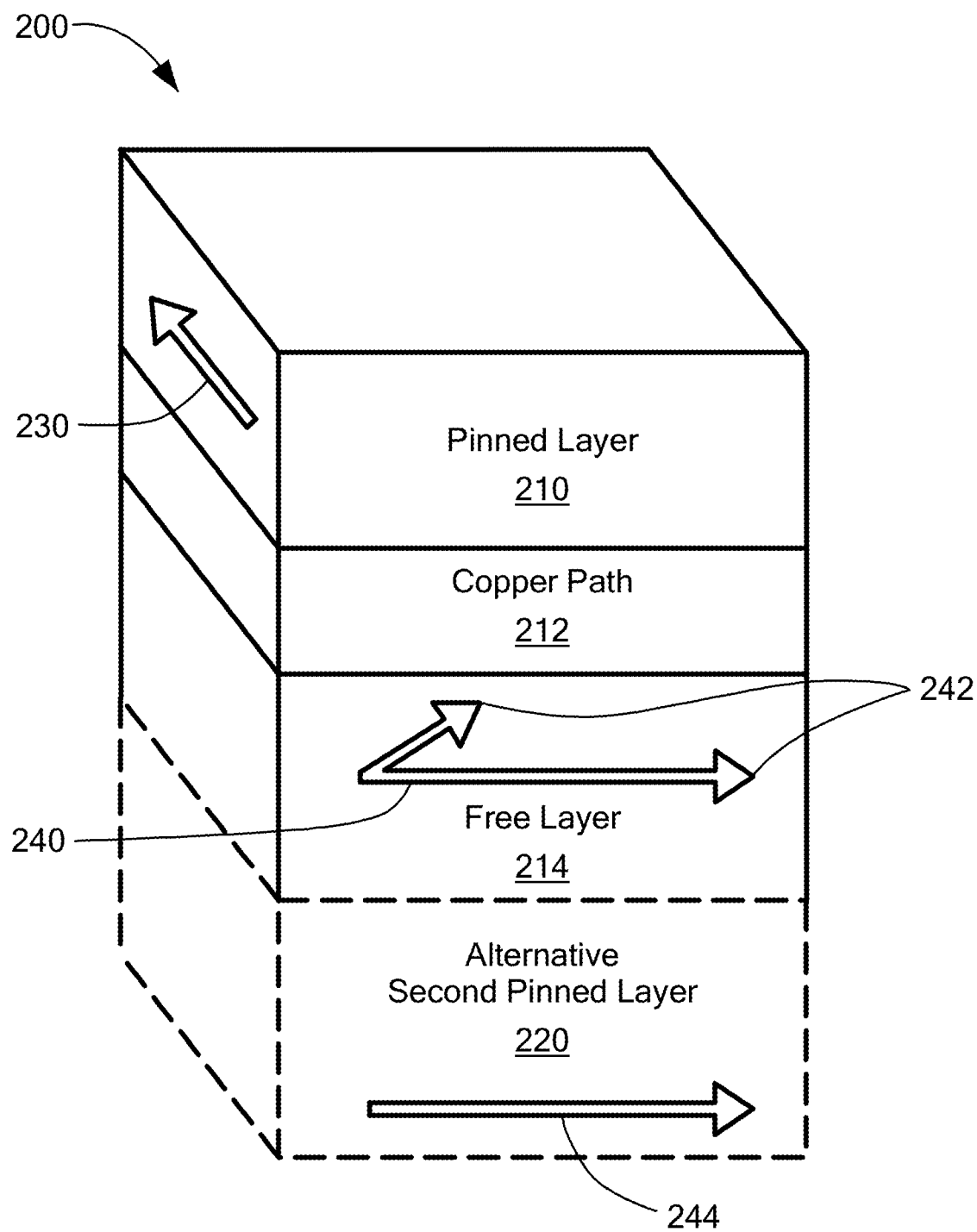
FIG. 2 is a perspective view of an illustrative GMR element that can form a part of a magnetic field sensor, according to some embodiments of the present disclosure.

FIG. 2 illustrates a simplified GMR element 200 that can form a part of the magnetic field sensor 10 of FIG. 1, according to some embodiments. The illustrative GMR element 200 has layered configuration including a pinned layer 210, a metal path 212, such as copper, and a free layer 214. The magnetic orientation of the pinned layer 210 may be fixed. The magnetic orientation of the free layer 214 can be maintained in a selected alignment through anisotropy or by the shown alternative second pinned layer 220, each of which provide a pinning field, which may be denoted $H_{an}$. The magnetic orientation of the free layer 214 can rotate 242 based on the applied magnetic field (e.g., by a magnetic field caused by target 14 of FIG. 1). As shown, anisotropy may be used to create a 90° zero applied field orientation 240 of the free layer 214, or a 90° zero applied field orientation 240 may be provided with the second pinned layer 220, which is 90° to the pinned layer.

The sensitivity of an MR element used in a back bias environment depends on the magnetic bias (internal or external to the MR structure). The bias induced by the magnet may not be uniform and the MR sensitivity changes with the position of the MR with regards to the magnet such that placement tolerances may be a factor in the accuracy of the sensor.

While certain embodiments of the present disclosure may be described in the context of magnetoresistance (MR) sensors, the magnet design described herein can generally be utilized within any type of back-biased magnetic field sensors including but not limited to Hall-effect, a magnetoresistance, and a magnetotransistor sensors.

Figure 3A:
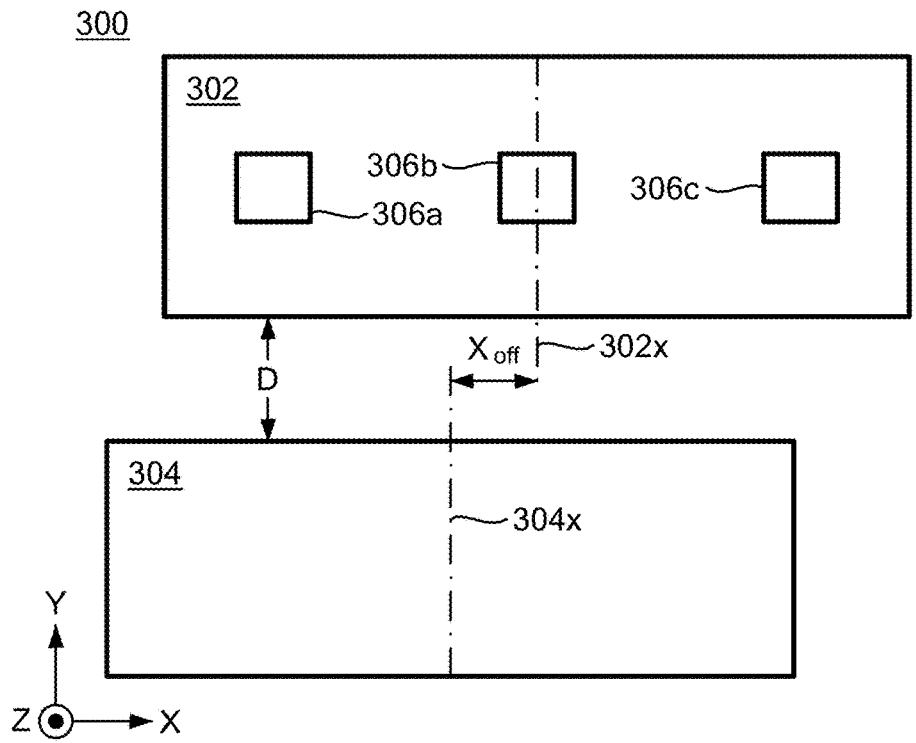
FIG. 3A is a top view of a portion magnetic field sensor showing misalignment between magnetic field sensing elements and a back bias magnet.
Figure 3B:
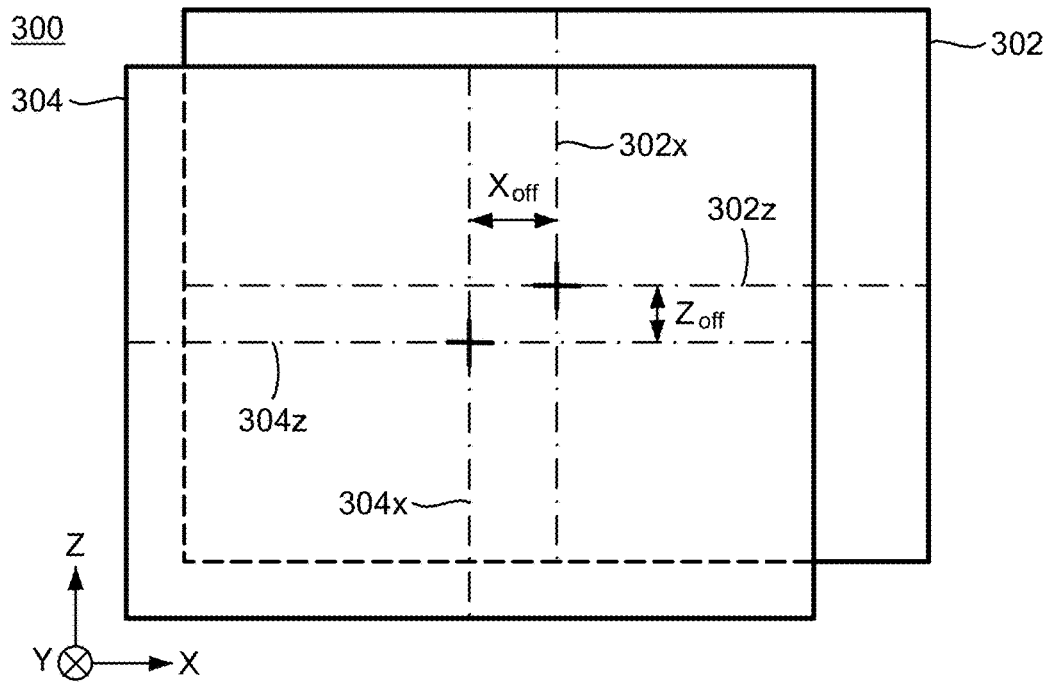
FIG. 3B is a front view of the magnetic field sensor portion of FIG. 3A.

FIGS. 3A and 3B illustrate misalignment that can occur between magnetic field sensing elements and a back bias magnet. FIG. 3A top a top view of a portion of magnetic field sensor 300 and FIG. 3B shows a front view of the sensor 300. For discussion purposes, the following coordinate system is assumed. In FIG. 3A, the X axis is parallel with the page and runs horizontal thereacross, the Z axis is perpendicular to the page, and the Y axis is parallel with the page and runs vertically thereacross. In FIG. 3B, the X axis is parallel with the page and runs horizontal thereacross, the Z axis is parallel to the page and runs vertically thereacross, and the Y axis is perpendicular to the page.

Figure 8A:
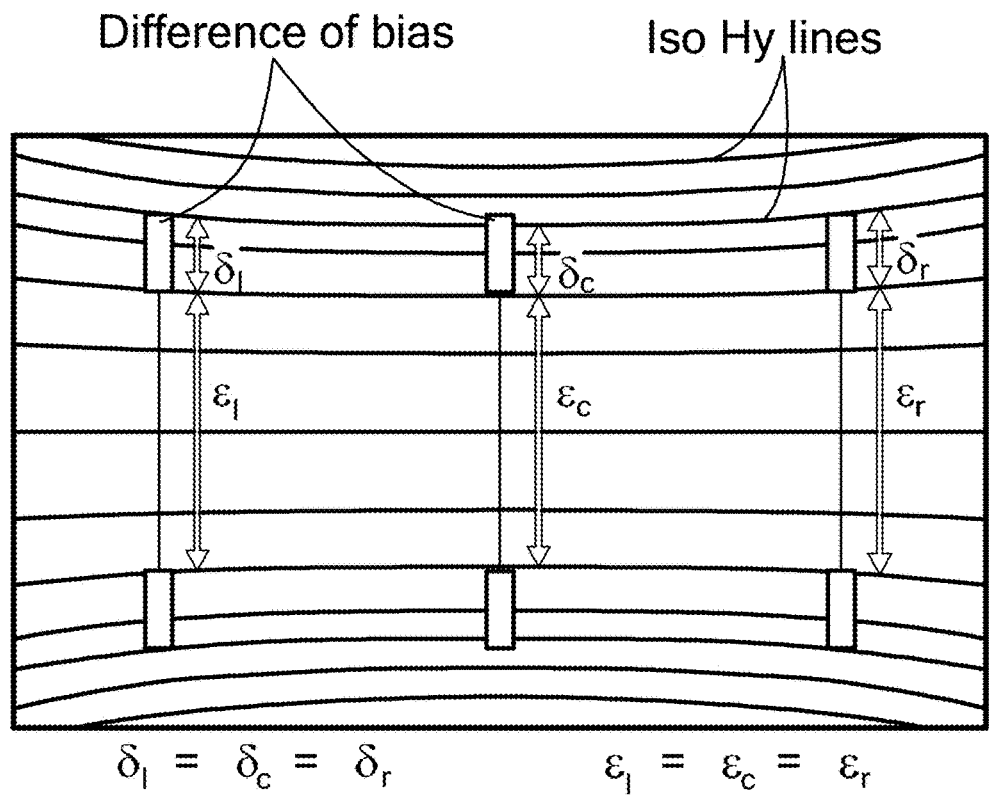
FIG. 8A shows an illustrative magnetic field sensor having magnetic field sensing elements and segments positioned in relation to a field of a magnet.
Figure 8B:
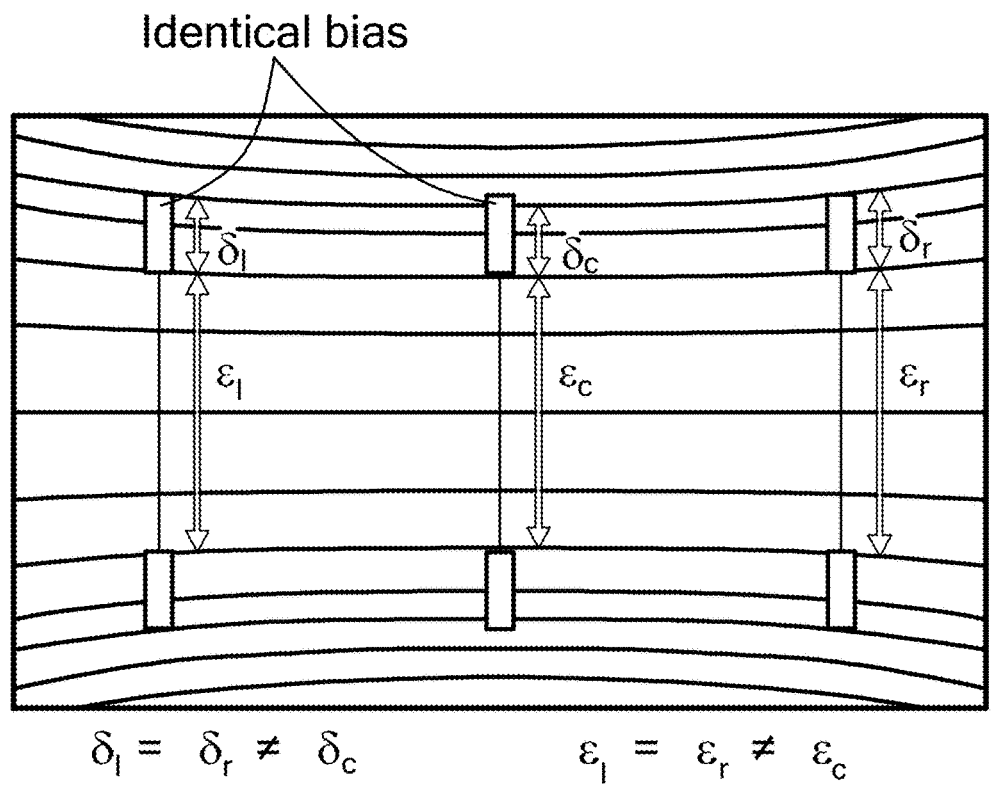
FIG. 8B shows an illustrative magnetic field sensor having magnetic field sensing elements and segments dimensioned and/or spaced in relation to a field of a magnet.
Figure 8C:
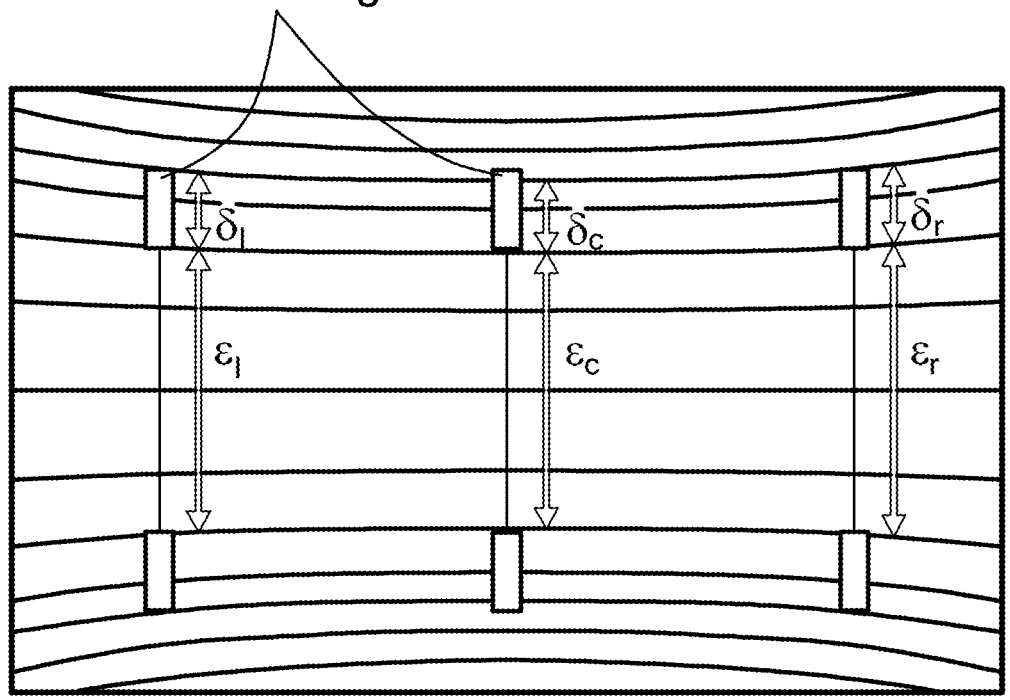
FIG. 8C shows an illustrative magnetic field sensor having magnetic field sensing elements and segments dimensioned and/or spaced in relation to a field of a magnet.

An illustrative magnetic field sensor 300 can include a die 302 having one or more magnetic field sensing elements 306a, 306b, 306c, etc. (306 generally) and a back bias magnet structure 304. The die 302 can also integrate various analog and digital circuitry not shown for the sake of clarity. As shown in the side view of FIG. 3A, in some embodiments the die 302 can include three magnetic field sensing elements 306a, 306b, 306c that are equally spaced (or approximately equally spaced) within the die 302. In other embodiments, different numbers of magnetic field sensing elements and spacing may be used. Examples of MR element dimensioning and spacing that may be used are shown in FIGS. 8A, 8B, and 8C and described below in the context thereof. Magnetic field sensing elements 306 are not shown in front view of FIG. 3B, also for the sake of clarity. The die 302 and the magnet structure 304 may be spaced apart by a distance D along the Y axis corresponding to a thickness of the packaging (e.g., plastic molding, die, leadframe, glue) in which the die 302 is provided.

Ideally, a X-axis centerline 302x of the die 302 may be aligned with a X-axis centerline 304x of the magnet structure 304 and a Z-axis centerline 302z of the die 302 may be aligned with a Z-axis centerline 304z of the magnet structure 304. However, due to misalignment (e.g., misalignment introduced during customer assembly), there may exist a horizontal misalignment $X_{off}$ along the X-axis and/or misalignment $Z_{off}$ along the Z-axis.

With existing back bias magnet designs, such misalignments may degrade the performance of sensor 300. In contrast, the disclosed magnet designs and structures may be immune to certain misalignments. In other words, using existing magnet designs, a magnetic field sensor may have a relatively low tolerance to X-axis misalignment, $X_{off}$, and/or Z-axis misalignment, $Z_{off}$, whereas disclosed embodiments provide for relatively high tolerance or immunity to such misalignment. Thus, the disclosed magnet design can enable the die 302 and the magnet structure 304 to be manufactured separately and later assembled together, whereas existing magnet designs may require that the die and the magnet be manufactured together as a single integrated package. For example, there are no known back-biased sensors using GMR that can be assembled by the customer. In addition, with the disclosed magnet design, the dimensions of the magnet structure 304 can be adjusted to accommodate different dimensions and spacings of the magnetic field sensing elements 306 (e.g., to provide suitable back bias magnetic field lines for the different dimensions and geometries of the die 302).

Figure 4:
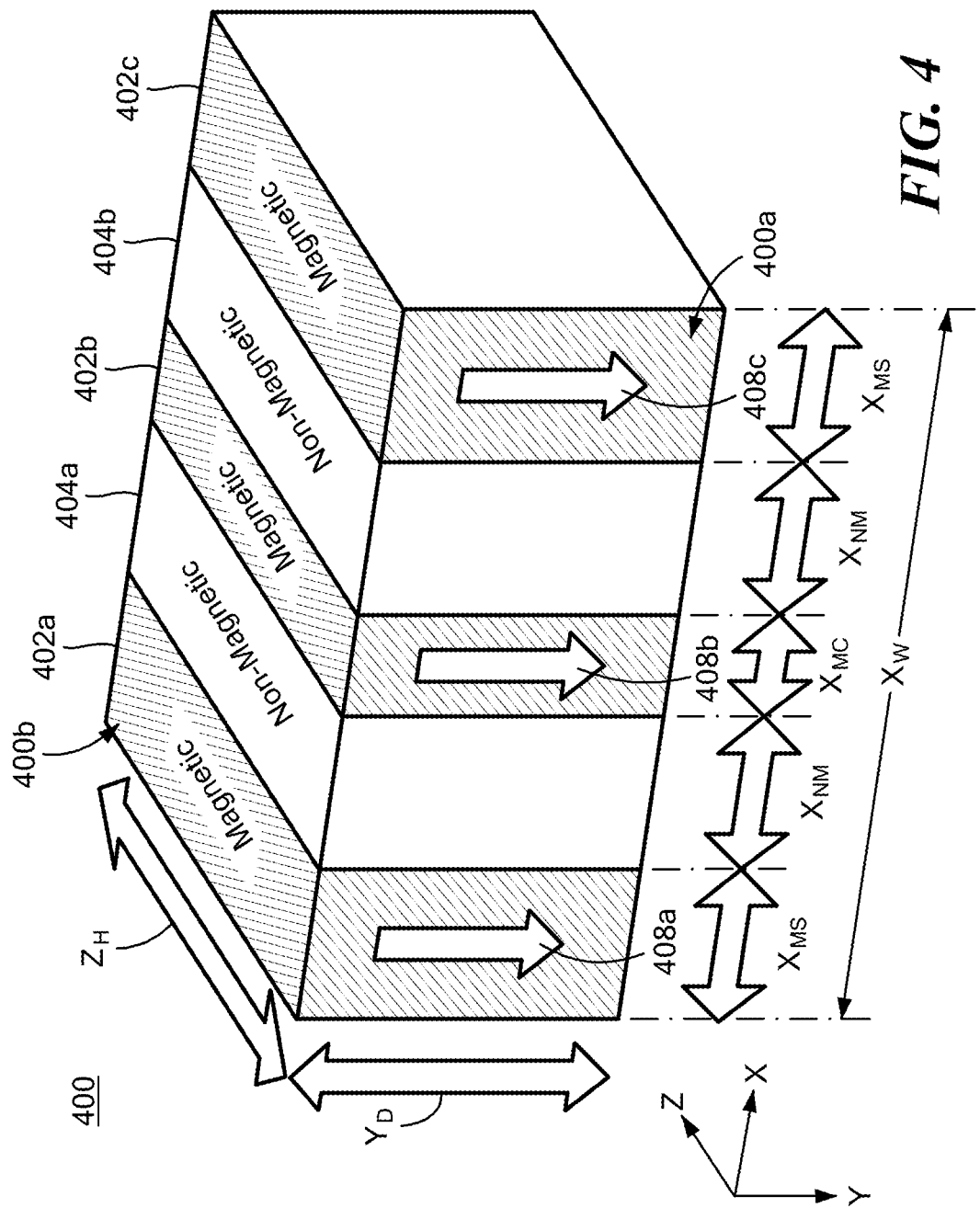
FIG. 4 perspective view of a magnet structure that can be used to back bias a magnetic field sensor, according to some embodiments of the present disclosure.

FIG. 4 illustrates a magnet structure 400 and a design thereof that can be used within back-biased magnetic field sensor applications, according to embodiments of the present disclosure. For example, magnet structure 400 may be provided as magnet structure 13 of FIG. 1 and/or as magnet structure 304 of FIGS. 3A and 3B.

The magnet structure 400 includes two or more layers of magnetic material 402a, 402b, 402c (402 generally) separated by layers of non-magnetic material 404a, 404b (404 generally). In the embodiment shown, three magnetic layers 402a, 402b, 402c are separated by two non-magnetic layers 404a, 404b. In other embodiments, different numbers of magnetic and non-magnetic layers may be provided. The magnetic layers 402 may be comprised of permanent magnets or ferromagnetic material oriented to produce magnetic fields in a given direction (e.g., the same direction for all magnetic layers 402). For example, as shown in FIG. 4, magnetic layers 402a, 402b, 402c may produce magnetic fields having a substantial directional component pointing downward along a first surface 400a of the magnet structure 400, as indicated by respective arrows 408a, 408b, 408c. In other words, magnetic layers 402 may be magnetized to produce a field along the positive Y axis of FIG. 4. A second surface 400b of the magnet structure 400 may correspond to the surface adjacent to the IC die/package when the magnet structure 400 is assembled therewith. The direction of magnetization may be reversed (e.g., along the negative Y axis) without affecting the overall magnet structure design.

Magnet structure 400 has a width $X_W$ measured along the X axis, a height $Z_H$ measured along the Z axis, and a depth or thickness $Y_D$ measured along the Y axis. The width $X_W$ can be equal to the sum of the widths of the individual layers 402, 404. For example, as shown in FIG. 4, in the case of three magnetic layers 402a, 402b, 402c, the outer magnetic layers 402a, 402c may have width $X_{MS}$ and the center magnetic layer 402b may have a width $X_{MC}$ that can be equal to or different from $X_{MS}$. This arrangement can minimize both Hx and the gradient of Hx at the sensing element positions (e.g., when the sensing elements are arranged in the manner illustrated in FIG. 7). Also as shown, the non-magnetic layers 404a, 404b may have a width $X_{NM}$, such that the total width $X_W$ of the magnet structure equals $2X_{MS}+X_{MC}+2X_{NM}$. The magnet structure 400 can have a parallelepiped shape with a volume $(2X_{MS}+2X_{NM}+X_{MC}) \cdot Z_H \cdot Y_D$. The various layers 402a, 404a, 402b, 404b, 402c may be attached together using an adhesive such as glue.

The number of design parameters for magnet structure 400 are thus limited to five, namely: outer magnetic layer width $X_{MS}$, center magnetic layer width $X_{MC}$, non-magnetic layer width $X_{NM}$, height $Z_H$, and depth $Y_D$. Having such a limited number of design parameters can simplify manufacturing. For example, existing back bias magnet designs may require complex shapes (e.g., not parallelepipedal or cylindrical) to achieve Hx and a gradient of Hx about the magnetic field sensing elements.

The magnet structure 400 shown in FIG. 4 may be suitable for use with a magnet sensor having three magnetic field sensing elements (e.g., three MR or Hall elements).

However, the layered magnet design disclosed herein can be adapted for other numbers of magnetic field sensing elements. More generally, in the case of N magnetic field sensing elements, a magnet structure according to the present disclosure can include N magnetic layers and N−1 non-magnetic layers, with N>=2. For example, the magnet structure can have N=4 magnetic layers to generate back bias fields on corresponding ones of 4 magnetic field sensing elements.

Each of the design parameters of the illustrative magnet structure 400 may have an impact on the field profile obtained. Thus, each of the parameters may be tuned in order to achieve Hx and a gradient of Hx close to zero at the locations of the magnetic field sensing elements. Such tuning allows the disclosed magnet structure to be adapted for a wide range of IC package geometries and die positions there within.

For example, the widths of the magnetic layers (i.e., parameters $X_{MS}$ and $X_{MC}$) may be selected based on the dimensions of the magnetic field sensing elements within the die.

As another example, the widths of the non-magnetic layers (i.e., parameter $X_{NM}$) may be selected based on the spacing between the magnetic field sensing elements within the die.

As yet another example, if the die onto which the magnetic field sensing elements is integrated is not centered within the IC package along the X and/or Z axes, the magnet structure 400 when assembled on the IC package may overhang the IC package along the X and/or Z axis. In this case, it may be preferable to select a relatively smaller depth $Y_D$ (i.e., the dimension along the Y axis) such that the volume of the portion of the magnet structure 400 that overhangs the IC sensor is reduced. With existing back bias magnet designs, the minimum achievable depth $Y_D$ may be about 3.8 mm whereas, with the disclosed magnet structure design may achieve a depth $Y_D$ of 1 mm or less. Using a smaller depth $Y_D$ may also result in a lower gradient of $H_X$ vs Y (i.e., the strength of the field along the X axis as the Y-axis position varies) allowing for a greater tolerance of the distance between the magnet structure 400 and the die (i.e., distance D in FIG. 3A). This may allow for (e.g., facilitate or enable) the magnet structure 400 to be assembled to the outside of an IC package enclosed in a molding (e.g., a plastic molding), where the tolerance of the molding thickness is relatively high. In contrast, existing back bias magnet designs may require that the magnet be embedded within the molded IC package. Moreover, the illustrated magnet design may achieve a smaller gradient $H_z$ vs X compared to existing back bias magnet designs. This means that it is more immune to X misplacement of the die vs the package. Also, it can allow for an increase in split element distance to tune the bias (hence the sensitivity) more finely while also increasing magnet-to-die misalignment immunity/tolerance. Examples of MR element dimensioning and spacing are shown in FIGS. 8A, 8B, and 8C and described below in the context thereof.

Figure 5A:
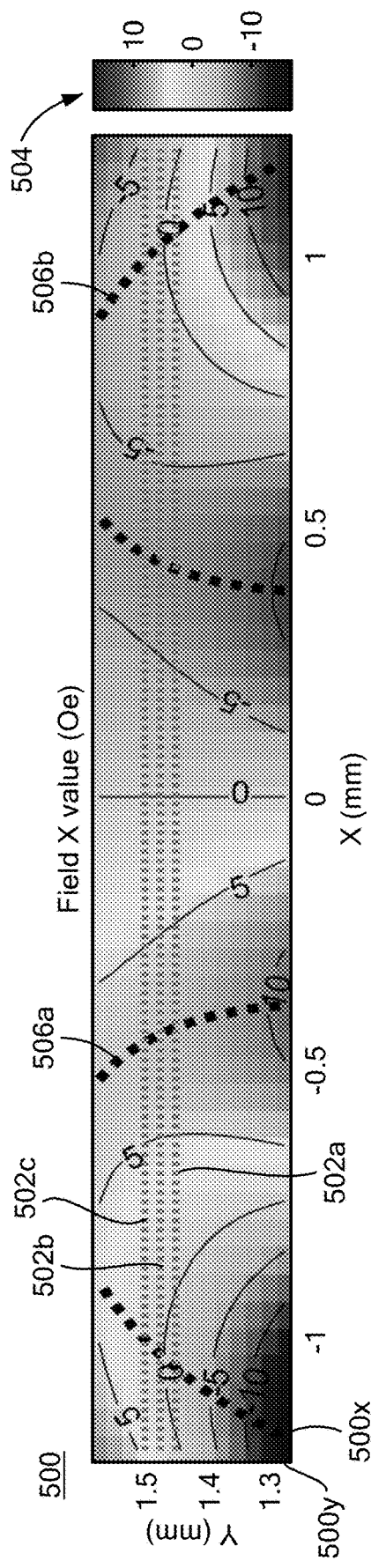
FIGS. 5A to 5C are magnetic field diagrams illustrating how embodiments of the disclosed magnet structure are immune to certain misalignments.
Figure 5B:
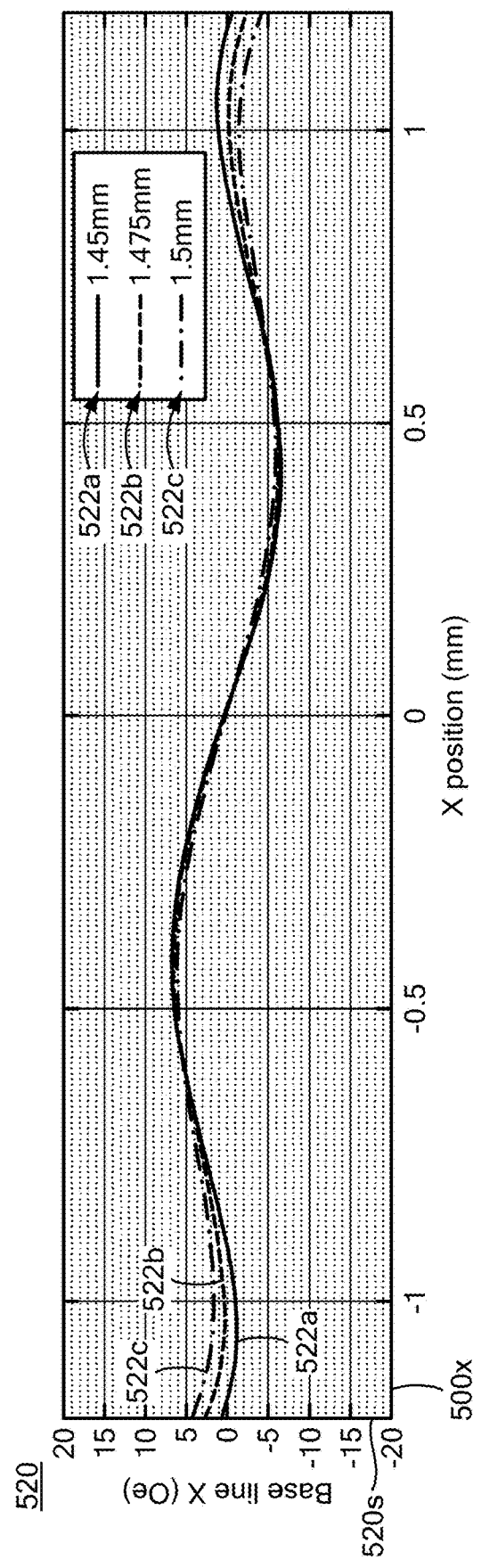
Figure 5C:
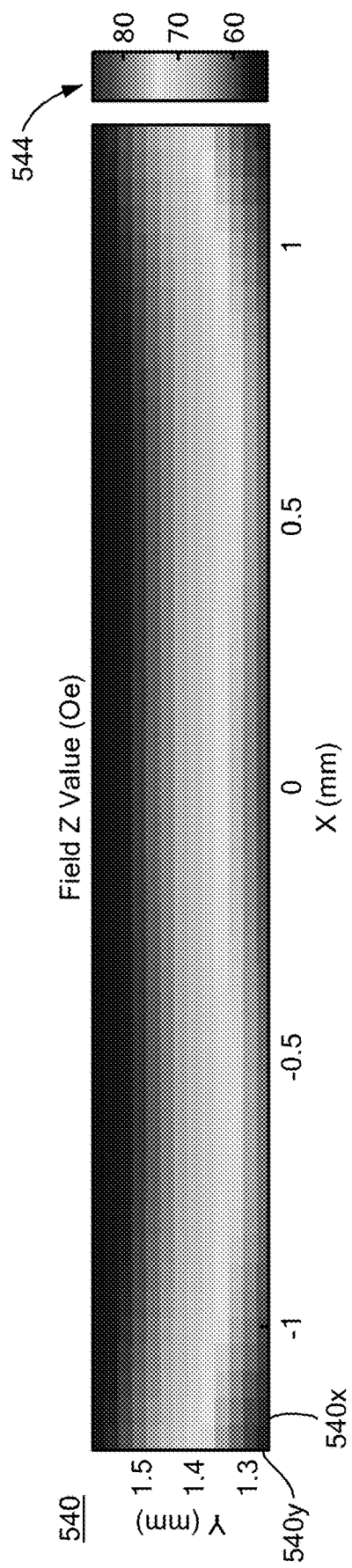

FIGS. 5A to 5C are magnetic field diagrams illustrating how embodiments of the disclosed magnet structure are immune to certain misalignments.

Referring to FIG. 5A, plot 500 illustrates an $H_X$ field map for a back bias magnetic field that may be produced by embodiments of the magnet structure design described herein. In this example, the magnetic field is mapped within an X-Y plane defined by horizontal axis 500x corresponding to X-axis positions and vertical axis 500y corresponding to Y-axis positions. The direction and strength of the field along the X axis at various points in the X-Y plane are indicated using different shades of grey representing different in units of oersted (Oe), as denoted by scale 504.

FIG. 5B shows another a plot 520 of the same magnetic field as in FIG. 5A, taken across three different positions along the Y axis 500y. The two plots 500, 520 share the same horizontal 500x corresponding to X-axis positions but have different vertical axes. In particular, vertical axis 520s in FIG. 5B corresponds to the magnetic field strength (Oe) instead of Y-axis positions. A first curve 522a in FIG. 5B corresponds to magnetic field strength, $H_X$, along a first horizontal line 502a in FIG. 5A, a second curve 522b in FIG. 5B corresponds to field strength along a second horizontal line 502b in FIG. 5A, and a third curve 522c in FIG. 5B corresponds to field strength along a third horizontal line 502c in FIG. 5A. As shown, horizontal lines 502a, 502b, and 502c correspond to lines having fixed Y-axis positions of 1.45 mm, 1.475 mm, and 1.5 mm, respectively.

The magnet structure producing the field illustrated by plots 500 and 520 may be designed so as to produce a back bias field about three (3) magnetic field sensing elements located at positions −1, 0, and 1 along the X axis 500x. As one example, the magnet structure may have the following parameters: $X_{MS}$=1.15 mm, $X_{MC}$=1.14 mm, $X_{NM}$=610 µm, $Z_H$=4 mm, $Y_D$=1 mm. As noted previously, existing magnet structures may have depth of 3.8 mm or greater (i.e., $Z_D$>=3.8 mm) so as to produce a suitable back bias field for a sensor having three (3) magnetic field sensing elements and, more particularly, three (3) MR elements.

As illustrated by plots 500 and 520, the magnet structure is immune to certain misalignments along the Y axis 500y. In particular, for a magnetic field element positioned at points 0 along the X-axis, the applied field strength along the X axis ($H_X$) is substantially identical when the Y-axis position varies between 1.45 mm, 1.475 mm, and 1.5 mm (as illustrated by curves 522a, 522b, 522c). Likewise, the $H_X$ field strength varies only minimally for magnetic field elements located at X-axis positions −1 and 1 when the Y-axis position varies between 1.45 mm, 1.475 mm, and 1.5 mm.

Plot 500 also shows a gradient of $H_X$ vs X that may be significantly less than that of existing back bias magnet designs (e.g., three to four times less). In particular this is shown by lines 506a, 506b. This gradient reduction is a consequence of disclosed layer magnet design and the achievable magnet-to-sensing elements distance. This gradient reduction indicates better immunity to X-axis misalignment between the die and magnet structure. Also, as previously discussed, disclosed embodiments allow for a greater tolerance along the Z axis due to a lower Hx vs Z gradient.

Referring to FIG. 5C, plot 540 illustrates an $H_Z$ field map for a back bias magnetic field that may be produced by embodiments of the magnet structure design described herein. In this example, the magnetic field is mapped within an X-Y plane defined by horizontal axis 540x corresponding to X-axis positions and vertical axis 540y corresponding to Y-axis positions. The direction and strength of the field along the Z axis at various points in the X-Y plane are indicated using different shades of grey representing different in units of oersted (Oe), as denoted by scale 544. As can be seen, the disclosed magnet design can achieve a relatively small gradient of $H_z$ across X. This means that it is more immune to X misplacement of the die vs the package. Also, the disclosed magnet design may permit an increased distance between the GMR split element (e.g., such as shown in FIGS. 8A-8C) to tune the bias, and hence the sensitivity, more finely while achieving additional improvement of immunity to misplacement of magnet vs die.

Figure 6:
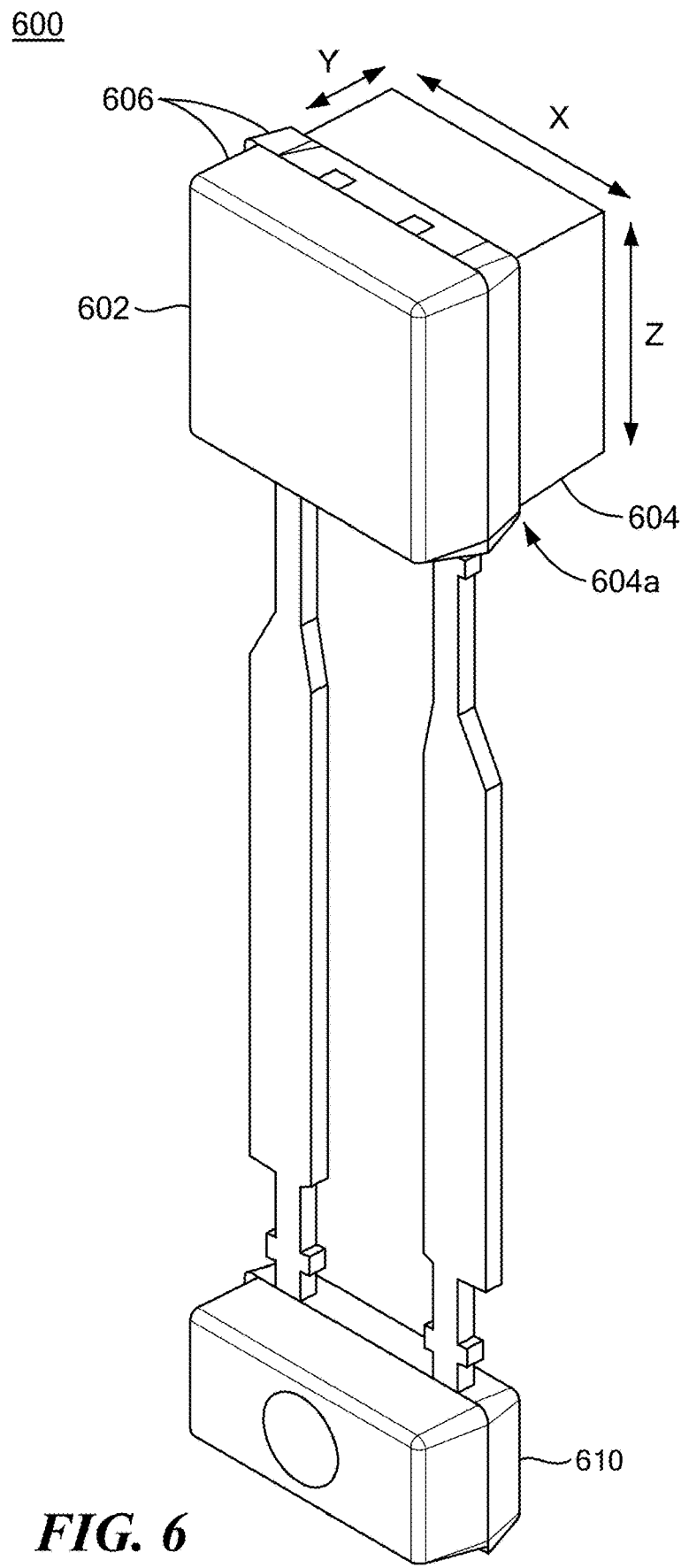
FIG. 6 is a perspective view showing a magnet structure assembled onto the back of an integrated circuit (IC) package, according to some embodiments of the present disclosure.

FIG. 6 shows a magnetic field sensor 600 having an IC package 602 and magnet structure 604 assembled onto the back thereof, according to some embodiments of the present disclosure. IC package 602 may include one or more magnetic field sensing elements (e.g., MR or Hall elements) integrated into a die (not visible in FIG. 6). IC package 602 can also include a molding 606 encasing the die. In some embodiments, IC package 602 may be provided as a 3-Pin SIP. Magnet structure 604 may have a layered design and may be the same as or similar to magnet structure 400 of FIG. 4. The magnet structure 604 can be configured to have a surface 604a that, when assembled to the IC package 602, produces a back bias magnetic field about the one or more magnetic field sensing elements therein. In some embodiments, the magnet structure 604 can be attached to the molding 606 using an adhesive such as glue. However other fasting means can be used including mechanical fasteners.

Figure 7:
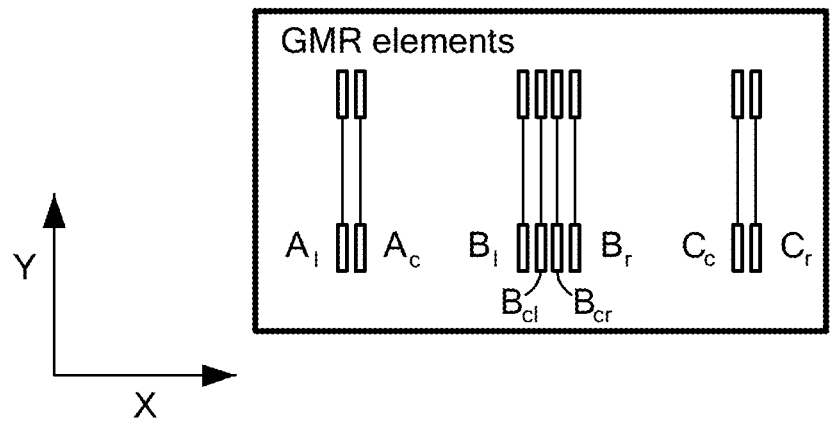
FIG. 7 is a schematic representation of a portion of a sensor having magnetic field sensing elements.
Figure 7A:
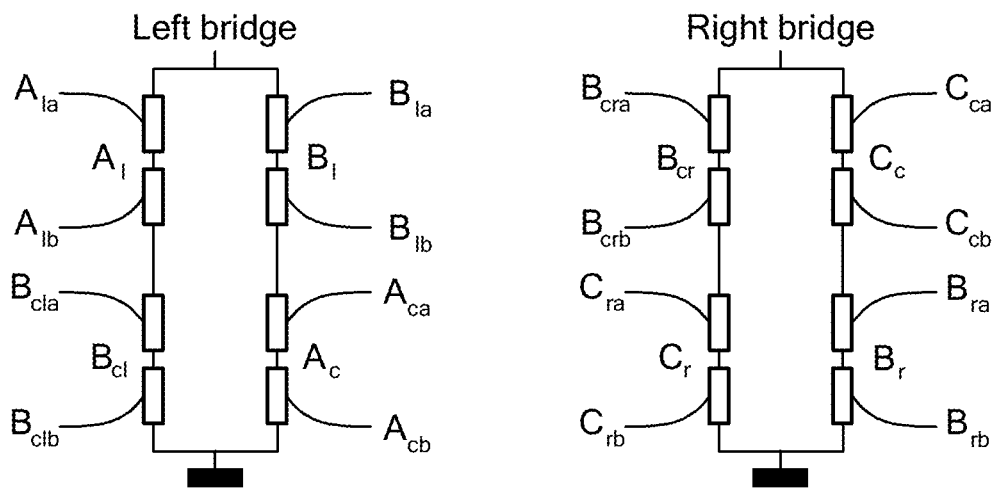
FIG. 7A shows a circuit representation of left and right bridges formed by the magnetic field sensing elements of FIG. 7.
Figure 7B:
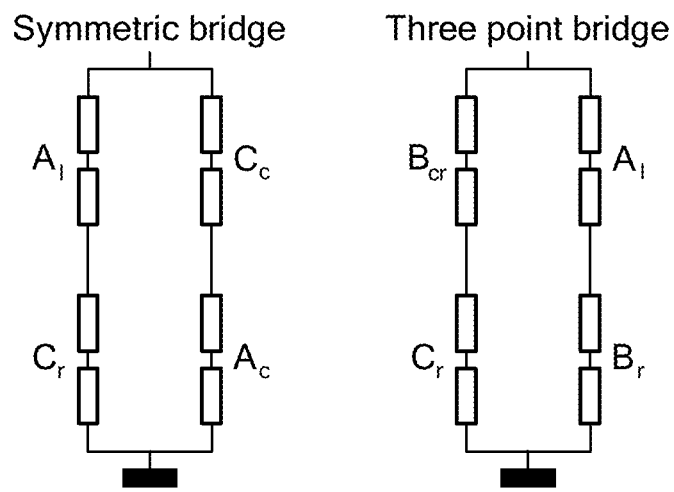
FIG. 7B shows symmetric and three-point bridges formed by the magnetic field sensing elements of FIG. 7.

FIG. 7 shows a sensor having GMR elements and FIGS. 7A and 7B show alternative bridge constructions in which GMR elements are subject to opposite bias. FIG. 7 shows first and second GMR bridges each having four elements where each element has first and second segments. FIG. 7A shows the left bridge and right bridge for bridges in the sensor of FIG. 7. Output signals in the left and right bridges can be used to determine speed and direction information. In one embodiment, subtraction and sum of signals in the left and right bridges outputs speed and direction information. The GMR elements are labeled such that subscription 1 refers to left, r refers to right, and c refers to center. Looking to FIG. 7, yokes Ax and Cx may be referred to a outer yoke Bx may be referred to as central or inner yokes. From left to right in FIG. 7, the GMR elements are listed as $A_l$, $A_c$, $B_l$, $B_{cl}$, $B_{cr}$, $B_r$, $C_c$, $C_r$. As seen in the left bridge of FIG. 7A, GMR element $A_l$ includes first and second segments $A_{la}$, $A_{lb}$, the GMR element $B_{cl}$ includes third and fourth elements $B_{cla}$, $B_{clb}$, and so on.

In this arrangement, the segments of the GMR elements do not experience the exact same bias conditions. For example, the bias field, which can be generated by a magnet, along Z axis (FIG. 7) varies slightly between inner and outer yoke. This produces a difference in sensitivity of the elements, resulting in a global sensitivity to common mode field.

FIG. 7B shows symmetric and three point bridge configurations that may be useful for a back bias speed sensor. In an embodiment, the symmetric bridge of $A_l$, $C_c$, $C_r$, and $A_c$, can be referred to as a direction channel and the three point bridge can be referred to as a speed channel. Yokes $A_x$ and $C_x$ can be referred to as outer yokes and yokes $B_x$ can be referred to as central or inner yokes (see FIG. 7).

In embodiments, yokes should be placed by pairs in a symmetric manner respective to the magnet. One yoke should be placed at a position +Yp and the second Ym=−Yp (assuming Y=0 is at the center of the magnet). Then the spacing S (e.g., 2*Yp) is selected high enough so that the bias due to the magnet is large enough to ensure a proper compensation of the misplacement along Y axis and stray field along that same axis and small enough to ensure the sensitivity is not too diminished for a far air gap signal. In embodiments, there is compensation for bias of the GMR and good tolerance to misplacements over airgap As shown in FIGS. 8A and 8B, to promote substantially equal bias on the GMR elements, the GMR elements and segments can be dimensioned and/or spaced according to the iso-lines of bias field along the axis perpendicular to the reference direction, i.e. Hy. As can be seen, in the example embodiment, there is a left GMR element, a center GMR element and a right GMR element, each having first and second segments. The left and right GMR elements are subject to different bias fields than the center elements as indicated by the iso-lines. The distance between the first and second segments of the left GMR element is $\varepsilon_l$ and the length of the segment is $\delta_l$. The distance between the segments of the center GMR element is $\varepsilon_c$ and the length of the segment is $\delta_c$. The distance between the first and second segments of the right GMR element is $\varepsilon_r$ and the length of the segment is $\delta_r$. In the illustrated embodiment of FIG. 8A, $\delta_l=\delta_r=\delta_c$ and $\varepsilon_l=\varepsilon_r=\varepsilon_c$. In the illustrated embodiment of FIG. 8B, $\delta_l=\delta_r\neq\delta_c$ and $\varepsilon_l=\varepsilon_r\neq\varepsilon_c$, as the center segment spacing and dimensions are different than the left and right segment spacing and dimension. In embodiments, $\delta_c$ is chosen so that Hy at the bottom of the upper yokes is the same on all left, center and right yokes. And Hy at the top of the upper yokes is the same on all left, center and right yokes. In embodiments, the yokes are all the same size and only the vertical spacing changes. The spacing is chosen so that the average Hy value across the central yoke is the same as on the sides. FIG. 8C shows identical average bias on the elements.

It is understood that the length of the segments and distance between segments can be unique and can be configured to meet the needs of a particular application.

The arrangement of FIG. 8B, for example, distributes substantially equal bias through the GMR bridge elements. To keep the same sensitivity, central yokes and outer yokes should have the same resistance in absence of any magnetic field. As the square resistance of the stack forming the GMR elements is the same and the vertical length is fixed, zero field resistance can be adapted by adapting the GMR element width and/or adding a GMR segment placed right beside an existing element. Such elements can be connected either in series or in parallel with existing elements. To this end, the sensitivity in Ω/Oe can be made substantially equal between each GMR element (when both the die and the magnet are perfectly aligned).

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Various embodiments of the concepts systems and techniques are described herein with reference to the related drawings. Alternative embodiments can be devised without departing from the scope of the described concepts. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to element or structure A over element or structure B include situations in which one or more intermediate elements or structures (e.g., element C) is between elements A and B regardless of whether the characteristics and functionalities of elements A and/or B are substantially changed by the intermediate element(s).

Furthermore, it should be appreciated that relative, directional or reference terms (e.g. such as "above," "below," "left," "right," "top," "bottom," "vertical," "horizontal," "front," "back," "rearward," "forward," etc.) and derivatives thereof are used only to promote clarity in the description of the figures. Such terms are not intended as, and should not be construed as, limiting. Such terms may simply be used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, with respect to an object or structure, an "upper" or "top" surface can become a "lower" or "bottom" surface simply by turning the object over. Nevertheless, it is still the same surface and the object remains the same. Also, as used herein, "and/or" means "and" or "or," as well as "and" and "or." Moreover, all patent and non-patent literature cited herein is hereby incorporated by references in their entirety.

The terms "disposed over," "overlying," "atop," "on top," "positioned on" or "positioned atop" mean that a first element, such as a first structure, is present on a second element, such as a second structure, where intervening elements or structures (such as an interface structure) may or may not be present between the first element and the second element. The term "direct contact" means that a first element, such as a first structure, and a second element, such as a second structure, are connected without any intermediary elements or structures between the interface of the two elements. The term "connection" can include an indirect connection and a direct connection.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A magnetic field sensor comprising:
three or more magnetic field sensing elements spaced apart from each other in a direction along a first axis, each of the three or more magnetic field sensing elements comprising at least two segments; and
a magnet structure to provide a bias magnetic field about the three or more magnetic field sensing elements, the magnet structure including a plurality of layers attached together that alternate between magnetic layers and non-magnetic layers in the direction along the first axis, at least two of the magnetic layers having a first width and at least one of the magnetic layers having a second width different than the first width,
wherein a first segment of the at least two segments of each of the three or more magnetic field sensing elements is positioned above a central axis of the magnet structure and a second segment of the at least two segments of each of the three or more magnetic field sensing elements is positioned below the central axis of the magnet structure.

2. The magnetic field sensor of claim 1, wherein the magnet structure includes three magnetic layers and two non-magnetic layers.

3. The magnetic field sensor of claim 1, wherein the magnet structure has a dimension defined by dimensions of individual ones of the magnetic layers and dimensions of individual ones of the non-magnetic layers.

4. The magnetic field sensor of claim 1, wherein the magnet structure has a parallelepiped shape.

5. The magnetic field sensor of claim 1, wherein the three or more magnetic field sensing elements include one or more magnetoresistance (MR) elements.

6. The magnetic field sensor of claim 5, wherein the three or more magnetic field sensing elements includes three magnetoresistance (MR) elements.

7. The magnetic field sensor of claim 1, wherein the three or more magnetic field sensing elements include one or more Hall effect elements.

8. The magnetic field sensor of claim 1, wherein the three or more magnetic field sensing elements are enclosed with a packaging configured for attachment of the magnet structure.

9. The magnetic field sensor of claim 1, wherein the three or more magnetic field sensing elements are positioned with respect to the magnetic layers such that a strength of the bias magnetic field is substantially the same for each of the three or more magnetic field sensing elements.

10. The magnetic field sensor of claim 1, wherein the three or more magnetic field sensing elements are equally spaced from one another along the first axis.

11. The magnetic field sensor of claim 1, wherein a total number of magnetic layers in the magnet structure is equal to a total number of magnetic field sensing elements in the magnetic field sensor.

12. The magnetic field sensor of claim 2, wherein widths of the three magnetic layers correspond to dimensions of the three or more magnetic field sensing elements.

13. The magnetic field sensor of claim 1, wherein widths of the non-magnetic layers are selected to correspond to a spacing between the magnetic field sensing elements.

14. The magnetic field sensor of claim 1, wherein the three or more magnetic field sensing elements comprise bridge constructions that subject the three or more magnetic field sensing elements to different biases.

15. A magnetic field sensor comprising:
  three or more magnetic field sensing elements spaced apart from each other in a direction along a first axis; and
  a magnet structure to provide a bias magnetic field about the three or more magnetic field sensing elements, the magnet structure including a plurality of layers attached together that alternate between magnetic layers and non-magnetic layers in the direction along the first axis, the magnet structure including at least three magnetic layers,
  wherein the three or more magnetic field sensing elements are positioned with respect to the magnetic layers such that a strength of the bias magnetic field is substantially the same for each of the three or more magnetic field sensing elements, and
  wherein the three or more magnetic field sensing elements are positioned with respect to the magnetic layers such that each of the three or more magnetic field sensing elements is aligned with a respective one of the at least three magnetic layers along the first axis.

16. The magnetic field sensor of claim 15, wherein the magnet structure comprises at least two non-magnetic layers.

17. The magnetic field sensor of claim 15, wherein the three or more magnetic field sensing elements comprise three magnetoresistance (MR) elements.

18. The magnetic field sensor of claim 15, wherein the three or more magnetic field sensing elements are enclosed with a packaging configured for attachment of the magnet structure.

19. The magnetic field sensor of claim 16, wherein at least two of the at least three magnetic layers have a first width and at least one of the at least three magnetic layers has a second width different than the first width.

* * * * *